United States Patent [19]

Steel

[11] 3,866,137

[45] Feb. 11, 1975

[54] PHASE LOCKED FREQUENCY DIVIDER CIRCUITRY

[75] Inventor: Francis R. Steel, Pompano Beach, Fla.

[73] Assignee: Motorola, Inc., Chicago, Ill.

[22] Filed: Sept. 14, 1973

[21] Appl. No.: 397,482

[52] U.S. Cl. .......... 331/18, 331/25, 331/30, 331/41

[51] Int. Cl. .......... H03b 3/08

[58] Field of Search .......... 331/36 C, 40, 22, 30, 18, 331/27, 41

[56] References Cited

UNITED STATES PATENTS

| | | | |
|---|---|---|---|
| 2,521,058 | 9/1950 | Goldberg | 331/27 |
| 2,938,171 | 5/1960 | Royden | 331/41 |
| 3,021,492 | 2/1962 | Kaufman | 331/36 C |
| 3,249,886 | 5/1966 | Anderson et al. | 331/18 |
| 3,251,003 | 5/1966 | Farmer | 331/40 |
| 3,277,390 | 10/1966 | McLin | 331/30 |
| 3,509,483 | 4/1970 | Noyes, Jr. | 331/22 |

*Primary Examiner*—John Kominski

*Attorney, Agent, or Firm*—Eugene A. Parsons; Vincent J. Rauner

[57] ABSTRACT

A reference crystal oscillator and a voltage controllable crystal oscillator, having frequencies separated by a desired frequency, each supplying a signal to a mixer which provides an output signal of the desired frequency. The output signal of the mixer and the signal from the reference oscillator are supplied to a sample and hold phase detector which supplies a control signal to the voltage controllable crystal oscillator to maintain the frequency thereof the desired frequency from the frequency of the reference crystal oscillator. The frequency control range of the voltage controllable crystal oscillator is less than the desired frequency by a factor of at least the desired frequency division ratio.

7 Claims, 1 Drawing Figure

PATENTED FEB 11 1975 3,866,137
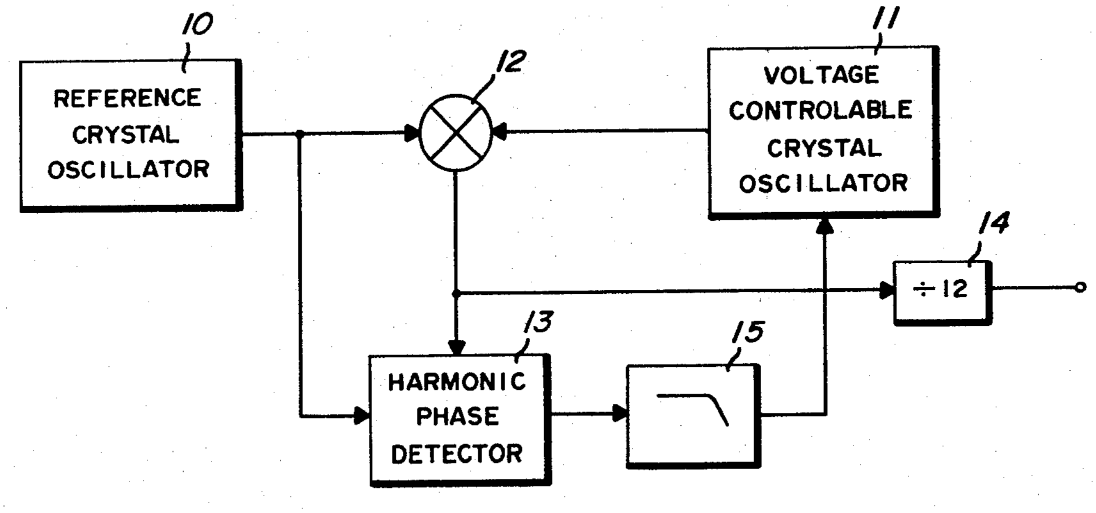

PHASE LOCKED FREQUENCY DIVIDER CIRCUITRY

BACKGROUND OF THE INVENTION

1. Field of the Invention

In many electronic devices it is desirable to provide a small low frequency reference source. In general, to provide a low frequency reference the output of a crystal oscillator must be passed through a series of divider circuits. Regenerative frequency dividers have doubtful stability and digital dividers require a substantial amount of power. In portable radios, for example, current drain is critical and must be minimized and sideband noise, which is low in crystal oscillators, must also be minimized.

2. Description of the Prior Art

A great variety of circuits commonly known as "phase locked loops" are utilized to obtain signals with stable frequencies. In general, all of these circuits incorporate frequency dividers or multipliers in the loop to obtain the desired frequency. However, the use of a frequency divider or a multiplier circuit in the loop requires substantial amounts of power. Further, in most prior art circuits the oscillator being conntrolled is an LC circuit or the like, rather than a crystal oscillator.

SUMMARY OF THE INVENTION

The present invention pertains to a frequency divider for providing a desired frequency utilizing a phase locked loop including a reference crystal oscillator and a voltage controllable crystal oscillator supplying signals to a mixer, which signals are approximately the desired frequency apart, with the output of the mixer and the output of the reference oscillator supplying signals to a harmonic phase detector, which in turn supplies a control voltage to the voltage controllable crystal oscillator to maintain the frequency of the output signal thereof the desired frequency from the output of the reference crystal oscillator.

It is an object of the present invention to provide an improved phase locked frequency divider.

It is a further object of the present invention to provide a relatively small and accurate low frequency reference, utilizing relatively low power and producing low noise.

These and other objects of this invention will become apparent to those skilled in the art upon consideration of the accompanying specification, claims and drawing.

BRIEF DESCRIPTION OF THE DRAWING

The single FIGURE is a block diagram of an embodiment of the present invention.

DESCRIPTION OF THE PREFERRED EMBODIMENT

In the FIGURE the numeral 10 designates a reference crystal oscillator which may operate at any harmonic of the frequency it is desired to produce. A second crystal oscillator 11, which is a voltage controllable crystal oscillator, also operates at a harmonic of the desired frequency but separated from the frequency of the reference crystal oscillator 10 by the desired frequency. The output signal from the reference crystal oscillator 10 and the signal from the voltage controllable crystal oscillator 11 are applied to a mixer 12 which supplies an output signal having a frequency equal to the difference between the frequencies of the two oscillators 10 and 11. The output signal from the mixer 12 is applied to a harmonic phase detector 13 and to a divider circuit 14, which provides the useful output of the circuitry. The output of the reference crystal oscillator 10 is also applied to the harmonic phase detector 13 and the output of the phase detector 13 is applied through a low pass filter 15 to control the voltage controllable crystal oscillator 11.

For purposes of explanation the desired frequency to be supplied by the circuitry, prior to any division by the circuit 14, is 300 kilohertz. The frequency of the reference crystal oscillator 10 is 11.1 megahertz and the frequency of the voltage controllable crystal oscillator 11 is 10.8 megahertz. The mixer 12 supplies a signal which has a frequency equal to the difference between the frequencies of the two crystal oscillators 10 and 11, which is 300 kilohertz. In the present embodiment the 300 kilohertz signal is divided by 12 in the divider 14 to provide a 25 kilohertz signal at the output of the circuitry. It should of course be understood that the crystal oscillators 10 and 11 might be operated at any pair of adjacent harmonics of the desired frequency and a divider, such as divider 14, might be utilized if desired. If the crystals in the oscillators 10 and 11 are chosen with a sufficiently high frequency it may be possible to package both crystals in a single container or housing. The frequency acquisition range of the loop controlling oscillator 11 must be sufficient to correct any error between the desired output frequency of mixer 12 and the free-running frequency. The acquisition range must, therefore, exceed the inherent instability of the frequency different between oscillators 10 and 11. Further, the instability plus the acquisition range must be small enough that the system cannot lock on a wrong harmonic of the output of mixer 12. These requirements can be met simultaneously if the inherent instability of the frequency difference between oscillators 10 and 11 is less than the desired difference by a factor of at least twice the division ratio. In this embodiment, the division ratio (11.1 MHz to 300 KHz) is 37 and the maximum allowable instability is 300 KHz divided by 74 or approximately 4 KHz. This order of stability is easily obtained with crystal oscillators.

The harmonic phase detector 13 simply determines the synchronous relationship between the frequency of the signal from the mixer 12 and the frequency of the signal from the crystal oscillator 10. This may be accomplished in a variety of ways, the most common being through sampling techniques. In a sampling circuit the amplitude of the signal from the crystal oscillator 10 is sampled at a rate equal to the frequency of the signal from the mixer 12. In the present embodiment the frequency of the signal from the crystal oscillator 10 is approximately 37 times that of the signal from the mixer 12. If the phase detector 13 samples the signal from the crystal oscillator 10 at exactly the same point in the cycle each time, the output of the detector 13 will be constant and the voltage controllable crystal oscillator 11 will be maintained at the same frequency. If synchronism between the two signals applied to the detector 13 varies slightly, the signal from the crystal oscillator 10 will be sampled at a different point in the cycle and the amplitude will vary, causing the voltage applied to the voltage controllable crystal oscillator 11 to vary and, consequently, varying the frequency of the output thereof.

Thus, improved phase locked frequency divider circuitry is disclosed wherein a pair of crystal oscillators are utilized to obtain a low, stable frequency. Further, the circuitry requires very little power and produces only the noise of a crystal oscillator. Since the warp range of a crystal oscillator is relatively small, the low frequency can be obtained without using additional equipment to insure that the circuit is locked on the correct harmonic.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. Phase locked frequency divider circuitry for providing a signal having a desired frequency comprising:

a. crystal controlled reference means providing a first signal having a first frequency which is a harmonic of the desired frequency;

b. voltage variable crystal oscillator means providing a second signal having a second frequency different from the first frequency by the desired frequency;

c. mixer means connected to receive the first signal from said reference means and the second signal from said oscillator means and provide an output signal having substantially the desired frequency at an output thereof;

d. harmonic phase detector means connected to receive the first signal from said reference means and the output signal from the output of said mixer means, said phase detector means providing an output voltage indicative of a synchronous relationship between the first frequency and the desired frequency; and e. means coupling the output voltage from said phase detector means to said crystal oscillator means for varying the frequency of said second signal to maintain a relatively constant synchronism between the first frequency and the desired frequency.

2. Phase locked frequency divider circuitry for providing a signal having adesired frequency as claimed in claim 1 wherein the harmonic a desired detector means include sampling means for sampling the amplitude of the first signal at the rate of the desired frequency.

3. Phase locked frequency divider circuitry for providing a signal having a desired frequency as claimed in claim 2 wherein the coupling means include a low pass filter for converting the samples to a DC voltage.

4. Phase locked frequency divider circuitry for providing a signal having a desired frequency as claimed in claim 1 including in addition divider means connected to receive the output signal from the mixer and reduce the frequency thereof a predetermined amount.

5. Phase locked frequency divider circuitry for providing a signal having a desired frequency as claimed in claim 1 wherein the voltage variable crystal oscillator includes a crystal having a frequency control range less than the desired frequency of the output signal of the mixer means by a factor of at least the desired frequency division ratio.

6. Phase locked frequency divider circuitry for providing a signal having a desired frequency comprising:

a. crystal controlled reference means providing a first signal having a first frequency which is a harmonic of the desired frequency;

b. voltage variable crystal oscillator means having an acquisition range less than said desired frequency and providing a second signal having a second frequency different from the first frequency by the desired frequency;

c. mixer means connected to receive the first signal from said reference means and the second signal from said oscillator means and provide an output signal having substantially the desired frequency at an output thereof;

d. said reference means and said oscillator means having an inherent instability of the frequency difference therebetween less than the desired frequency by a factor of at least twice the division ratio between the first frequency and the desired frequency;

e. phase detector means having first and second inputs and an output;

f. means connecting the first input of said phase detector means to said mixer means for receiving the output signal therefrom;

g. means connecting the second input of said phase detector means to said reference means for receiving the first signal therefrom; and h. means coupling the output voltage from said phase detector means to said crystal oscillator means for varying the frequency of said second signal to maintain a relatively constant synchronism between the first frequency and the desired frequency.

7. Phase locked frequency divider circuitry as claimed in claim 6 wherein the crystal in the reference means and the crystal in the crystal oscillator are included in a single package.

* * * * *